(12) United States Patent
Gaillard et al.

(10) Patent No.: US 7,074,708 B2
(45) Date of Patent: Jul. 11, 2006

(54) METHOD OF DECREASING THE K VALUE IN SIOC LAYER DEPOSITED BY CHEMICAL VAPOR DEPOSITION

(75) Inventors: Frederic Gaillard, Rue des Tallifardierest (FR); Li-Qun Xia, Santa Clara, CA (US); Tian-Hoe Lim, Santa Clara, CA (US); Ellie Yieh, San Jose, CA (US); Wai-Fan Yau, Mountain View, CA (US); Shin-Puu Jeng, Tainan (TW); Kuowei Liu, Santa Clara, CA (US); Yung-Cheng Lu, Taipei (TW)

(73) Assignee: Applied Materials, Inc., Santa Clara, CA (US)

( * ) Notice: Subject to any disclaimer, the term of this patent is extended or adjusted under 35 U.S.C. 154(b) by 100 days.

(21) Appl. No.: 10/789,209

(22) Filed: Feb. 27, 2004

(65) Prior Publication Data

US 2004/0166665 A1 Aug. 26, 2004

Related U.S. Application Data

(63) Continuation of application No. 10/632,179, filed on Jul. 31, 2003, now Pat. No. 6,784,119, which is a continuation of application No. 09/679,843, filed on Oct. 5, 2000, now Pat. No. 6,627,532, which is a continuation-in-part of application No. 09/465,233, filed on Dec. 16, 1999, now Pat. No. 6,511,903, which is a continuation of application No. 09/021,788, filed on Feb. 11, 1998, now Pat. No. 6,054,379, and a continuation-in-part of application No. 09/553,461, filed on Apr. 19, 2000, now Pat. No. 6,593,247, and a continuation-in-part of application No. 09/162,915, filed on Sep. 29, 1998, now Pat. No. 6,287,990, and a continuation-in-part of application No. 09/185,555, filed on Nov. 4, 1998, now Pat. No. 6,303,523, and a continuation-in-part of application No. 09/247,381, filed on Feb. 10, 1999, now Pat. No. 6,348,725.

(51) Int. Cl.
*H01L 21/4763* (2006.01)

(52) U.S. Cl. .................. 438/623; 438/770; 438/775
(58) Field of Classification Search .............. 438/623, 438/478, 770, 772, 774, 787, 788, 789, 790, 438/795, 622, 780, 775, 624
See application file for complete search history.

(56) References Cited

U.S. PATENT DOCUMENTS 4,168,330 A 9/1979 Kaganowicz (Continued)

FOREIGN PATENT DOCUMENTS

DE 196 54 737 A1 7/1997

(Continued)

OTHER PUBLICATIONS

European Search Report for EP 00 11 2300, Dated Aug. 24, 2001.

(Continued)

*Primary Examiner*—David Nhu
(74) *Attorney, Agent, or Firm*—Moser, Patterson & Sheridan

(57) ABSTRACT

A method for processing a substrate including depositing a dielectric layer containing silicon, oxygen, and carbon on the substrate by chemical vapor deposition, wherein the dielectric layer has a carbon content of at least 1% by atomic weight and a dielectric constant of less than about 3, and depositing a silicon and carbon containing layer on the dielectric layer. The dielectric constant of a dielectric layer deposited by reaction of an organosilicon compound having three or more methyl groups is significantly reduced by further depositing an amorphous hydrogenated silicon carbide layer by reaction of an alkylsilane in a plasma of a relatively inert gas.

20 Claims, 7 Drawing Sheets

U.S. PATENT DOCUMENTS

| | | |
|---|---|---|
| 4,532,150 A | 7/1985 | Endo et al. |
| 4,557,946 A | 12/1985 | Sacher et al. |
| 4,789,648 A | 12/1988 | Chow et al. |
| 4,798,629 A | 1/1989 | Wood et al. |
| 4,812,325 A | 3/1989 | Ishihara et al. |
| 4,824,690 A | 4/1989 | Heinecke et al. |
| 4,828,880 A | 5/1989 | Jenkins et al. |
| 4,845,054 A | 7/1989 | Mitchener |
| 4,894,352 A | 1/1990 | Lane et al. |
| 4,900,591 A | 2/1990 | Bennett et al. |
| 4,973,511 A | 11/1990 | Farmer et al. |
| 4,981,724 A | 1/1991 | Hochberg et al. |
| 5,000,113 A | 3/1991 | Wang et al. |
| 5,028,566 A | 7/1991 | Lagendijk |
| 5,040,046 A | 8/1991 | Chabra et al. |
| 5,093,153 A | 3/1992 | Brochot et al. |
| 5,120,680 A | 6/1992 | Foo et al. |
| 5,124,014 A | 6/1992 | Foo et al. |
| 5,204,141 A | 4/1993 | Roberts et al. |
| 5,224,441 A | 7/1993 | Felts et al. |
| 5,246,887 A | 9/1993 | Yu |
| 5,250,473 A | 10/1993 | Smits |
| 5,279,867 A | 1/1994 | Friedt et al. |
| 5,290,736 A | 3/1994 | Sato et al. |
| 5,298,587 A | 3/1994 | Hu et al. |
| 5,314,724 A | 5/1994 | Tsukune et al. |
| 5,352,493 A | 10/1994 | Dorfman et al. |
| 5,360,646 A | 11/1994 | Morita |
| 5,362,526 A | 11/1994 | Wang et al. |
| 5,364,666 A | 11/1994 | Williams et al. |
| 5,465,680 A | 11/1995 | Loboda |
| 5,466,431 A | 11/1995 | Dorfman et al. |
| 5,468,520 A | 11/1995 | Williams et al. |
| 5,488,015 A | 1/1996 | Havemann et al. |
| 5,492,736 A | 2/1996 | Laxman et al. |
| 5,494,712 A | 2/1996 | Hu et al. |
| 5,508,368 A | 4/1996 | Knapp et al. |
| 5,554,570 A | 9/1996 | Maeda et al. |
| 5,559,367 A | 9/1996 | Cohen et al. |
| 5,563,105 A | 10/1996 | Dobuzinsky et al. |
| 5,578,523 A | 11/1996 | Fiordalice et al. |
| 5,593,247 A | 1/1997 | Endres et al. |
| 5,593,741 A | 1/1997 | Ikeda |
| 5,598,027 A | 1/1997 | Matsuura |
| 5,616,369 A | 4/1997 | Williams et al. |
| 5,618,619 A | 4/1997 | Petrmichl et al. |
| 5,637,351 A | 6/1997 | O'Neal et al. |
| 5,638,251 A | 6/1997 | Goel et al. |
| 5,679,413 A | 10/1997 | Petrmichl et al. |
| 5,683,940 A | 11/1997 | Yahiro |
| 5,693,563 A | 12/1997 | Teong |
| 5,700,720 A | 12/1997 | Hashimoto |
| 5,703,404 A | 12/1997 | Matsuura |
| 5,739,579 A | 4/1998 | Chiang et al. |
| 5,753,564 A | 5/1998 | Fukada |
| 5,789,319 A | 8/1998 | Havemann et al. |
| 5,807,785 A | 9/1998 | Ravi |
| 5,817,572 A | 10/1998 | Chiang et al. |
| 5,818,071 A | 10/1998 | Loboda et al. |
| 5,821,168 A | 10/1998 | Jain |
| 5,834,162 A | 11/1998 | Malba |
| 5,858,880 A | 1/1999 | Dobson et al. |
| 5,888,593 A | 3/1999 | Petrmichl et al. |
| 5,891,799 A | 4/1999 | Tsui |
| 5,989,998 A | 11/1999 | Sugahara et al. |
| 6,054,206 A | 4/2000 | Mountsier |
| 6,054,379 A | 4/2000 | Yau et al. |
| 6,068,884 A | 5/2000 | Rose et al. |
| 6,072,227 A | 6/2000 | Yau et al. |
| 6,140,226 A | 10/2000 | Grill et al. |
| 6,147,009 A | 11/2000 | Grill et al. |
| 6,159,871 A | 12/2000 | Loboda et al. |
| 6,169,021 B1 | 1/2001 | Akram et al. |
| 6,211,093 B1 | 4/2001 | Sandhu et al. |
| 6,242,366 B1 | 6/2001 | Beekman et al. |
| 6,287,990 B1 | 9/2001 | Cheung et al. |
| 6,303,523 B1 | 10/2001 | Cheung et al. |
| 6,340,628 B1 | 1/2002 | Van Cleemput et al. |
| 6,348,725 B1 | 2/2002 | Cheung et al. |
| 6,475,564 B1 | 11/2002 | Carter et al. |
| 6,479,408 B1 | 11/2002 | Shioya et al. |
| 6,479,409 B1 | 11/2002 | Shioya et al. |
| 6,511,903 B1 | 1/2003 | Yau et al. |
| 6,524,972 B1 | 2/2003 | Maeda |
| 6,537,929 B1 | 3/2003 | Cheung et al. ............ 438/790 |
| 6,562,690 B1 | 5/2003 | Cheung et al. |
| 6,570,256 B1 | 5/2003 | Conti et al. |
| 6,583,048 B1 | 6/2003 | Vincent et al. |
| 6,593,247 B1 | 7/2003 | Huang et al. |
| 6,627,532 B1 | 9/2003 | Gaillard et al. ............ 438/623 |
| 6,734,115 B1 | 5/2004 | Cheung et al. ............ 438/789 |
| 6,756,323 B1 | 6/2004 | Grill et al. |
| 6,764,958 B1 | 7/2004 | Nemani et al. |
| 6,770,573 B1 | 8/2004 | Grill et al. |
| 6,784,119 B1 | 8/2004 | Xia et al. ................. 438/780 |
| 6,790,789 B1 | 9/2004 | Grill |
| 6,825,130 B1 | 11/2004 | Todd |
| 6,846,515 B1 | 1/2005 | Vrtis et al. |
| 2002/0098714 A1 | 7/2002 | Grill et al. |
| 2002/0105084 A1 | 8/2002 | Li |
| 2003/0032306 A1 | 2/2003 | Conti et al. |
| 2003/0089992 A1 | 5/2003 | Rathi et al. |
| 2003/0139062 A1 | 7/2003 | Grill et al. |
| 2003/0198742 A1 | 10/2003 | Vrtis et al. |
| 2003/0232137 A1 | 12/2003 | Vrtis et al. |
| 2004/0096593 A1 | 5/2004 | Lukas et al. |
| 2004/0096672 A1 | 5/2004 | Lukas et al. |
| 2004/0155340 A1 | 8/2004 | Owada et al. |
| 2004/0175501 A1 | 9/2004 | Lukas et al. |
| 2004/0175957 A1 | 9/2004 | Lukas et al. |
| 2004/0197474 A1 | 10/2004 | Vrtis et al. |
| 2005/0051900 A1 | 3/2005 | Liu et al. |

FOREIGN PATENT DOCUMENTS

| | | |
|---|---|---|
| EP | 0 469 926 A1 | 2/1992 |
| EP | 0 774 533 A2 | 5/1997 |
| EP | 0 840 365 A2 | 5/1998 |
| EP | 0 849 374 A2 | 6/1998 |
| EP | 0 849 789 A2 | 6/1998 |
| EP | 0 935 283 A2 | 8/1999 |
| EP | 0 960 958 A2 | 12/1999 |
| EP | 1 123 991 A2 | 8/2001 |
| EP | 1 354 980 A1 | 10/2003 |
| WO | WO 99/08249 A1 | 2/1998 |
| WO | WO 99/38202 A1 | 7/1999 |
| WO | WO 99/55526 A1 | 11/1999 |
| WO | WO 99/63591 A1 | 12/1999 |

OTHER PUBLICATIONS

Laura Peters, "Pursuing the Perfect Low K Dielectrics" Semiconductor International, Sep. 1998.

Bin Zhao, et al. "Integration of Low Dielectrics Constant Materials in Advanced Aluminum & Copper Interconnects", Materials Research Symposium Proc., vol. 564, Materials Research Society, 1999. pp. 485–497.

European Search Report for EP 01 30 3567, dated Nov. 4, 2004 (AMAT/2592.P3).

Bakli, et al., "Materials and Processing for .025µm Multilevel Interconnect," Microlectronic Engineering 33 (1997) pp. 175–188.

Bhan, et al., "Deposition of Stable Low K and High Deposition Rate $SiF_4$–Doped TEOS Fluorinated Silicon Dioxide (SiOF) Films," Thin Solid Films 308–309 (1997) pp. 507–511.

C.F. Lin, et al., "Improved Ozone–Tetraethoxysilane Oxide Reliability for Deep Submicron Inter–Metal Dielectric Applications by Deposition of a Silane–Based Oxide Underlayer," Thin Solid Films 308–309 (1997) pp. 621–626.

European Search Report from European Patent Office for 99906897.6 (2592.EP), dated Jan. 10, 2005.

METHOD OF DECREASING THE K VALUE IN SIOC LAYER DEPOSITED BY CHEMICAL VAPOR DEPOSITION

RELATED APPLICATIONS

This application is:

a continuation of U.S. patent application Ser. No. 10/632,179, filed on Jul. 31, 2003 now U.S. Pat. No. 6,784,119, which is a continuation of U.S. patent application Ser. No. 09/679,843, filed on Oct. 5, 2000, now issued as U.S. Pat. No. 6,627,532, which is a continuation-in-part of U.S. patent application Ser. No. 09/465,233, filed on Dec. 16, 1999, now issued as U.S. Pat. No. 6,511,903, which is a continuation of U.S. patent application Ser. No. 09/021,788, which was filed on Feb. 11, 1998, now issued as U.S. Pat. No. 6,054,379;

a continuation-in-part of U.S. patent application Ser. No. 09/553,461, which was filed on Apr. 19, 2000, now issued as U.S. Pat. No. 6,593,247;

a continuation-in-part of U.S. patent application Ser. No. 09/162,915, which was filed on Sep. 29, 1998, now issued as U.S. Pat. No. 6,287,990;

a continuation-in-part of U.S. patent application Ser. No. 09/185,555, which was filed on Nov. 4, 1998, now issued as U.S. Pat. No. 6,303,523;

and a continuation-in-part of U.S. patent application Ser. No. 09/247,381, filed on Feb. 10, 1999, now issued as U.S. Pat. No. 6,348,725. Each of the related applications is incorporated by reference herein.

BACKGROUND OF THE DISCLOSURE

FIELD OF THE INVENTION

The present invention relates to the fabrication of integrated circuits. More particularly, the invention relates to a process for depositing dielectric layers on a substrate and the structures formed by the dielectric layer.

BACKGROUND OF THE INVENTION

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

In order to further reduce the size of devices on integrated circuits, it has become necessary to use conductive materials having low resistivity and insulators having low k (dielectric constant <4.0) to reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process.

A liner/barrier layer is typically deposited between subsequently deposited conductive materials and the low k dielectric material to prevent diffusion of byproducts such as moisture onto the conductive materials. For example, moisture that can be generated during formation of a low k insulator readily diffuses to the surface of the conductive metal and increases the resistivity of the conductive metal surface. A barrier/liner layer formed from conventional silicon oxide or silicon nitride materials can block the diffusion of the byproducts. Similarly, a capping layer may be deposited on a low k dielectric gap film to prevent diffusion of contaminants such as moisture. However, the barrier/liner layers and capping layers typically have dielectric constants that are significantly greater than 4.0, and the high dielectric constants result in a combined insulator that does not significantly reduce the dielectric constant.

Therefore, there remains a need for dielectric layers having low dielectric constants and adjacent liner/barrier layers that provide an overall low dielectric constant.

SUMMARY OF THE INVENTION

The present invention generally provides a method for depositing a silicon oxycarbide layer having a low dielectric constant and depositing a silicon and carbon containing layer on the silicon oxycarbide layer. In one aspect, the invention provides a method for processing a substrate comprising depositing a dielectric layer comprising silicon, oxygen, and carbon on the substrate, wherein the dielectric layer has a carbon content of at least 1% by atomic weight and a dielectric constant of less than about 3, and depositing a silicon and carbon containing layer on the dielectric layer. The silicon and carbon containing layer can be an amorphous silicon carbide layer that may be doped with oxygen, nitrogen, or both.

Another aspect of the invention provides for a method for processing a substrate, comprising depositing a dielectric layer on the substrate by reacting an organosilane compound and an oxidizing gas, wherein the dielectric layer has a carbon content of at least 1% by atomic weight and a dielectric constant of less than about 3, and depositing a silicon carbide layer or doped silicon carbide layer on the dielectric layer at plasma conditions sufficient to reduce the dielectric constant of the dielectric layer.

In another aspect of the invention, a method is provided for processing a substrate, comprising depositing a dielectric layer on the substrate by reacting an organosilicon compound comprising three or more alkyl groups with ozone, wherein the dielectric layer has a carbon content between about 5% and about 50% by atomic weight and a dielectric constant less than about 3, and depositing a silicon carbide layer or doped silicon carbide layer on the dielectric layer by reacting an alkylsilane compound at plasma conditions sufficient to reduce the dielectric constant of the dielectric layer to less than about 2.4.

Another aspect of the invention provides for a substrate comprising a dielectric layer comprising silicon, oxygen, and carbon, wherein the dielectric layer has a carbon content of at least 1% by atomic weight, and a silicon and carbon containing layer capping the dielectric layer. The dielectric layer preferably has a dielectric constant less than about 2.4.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
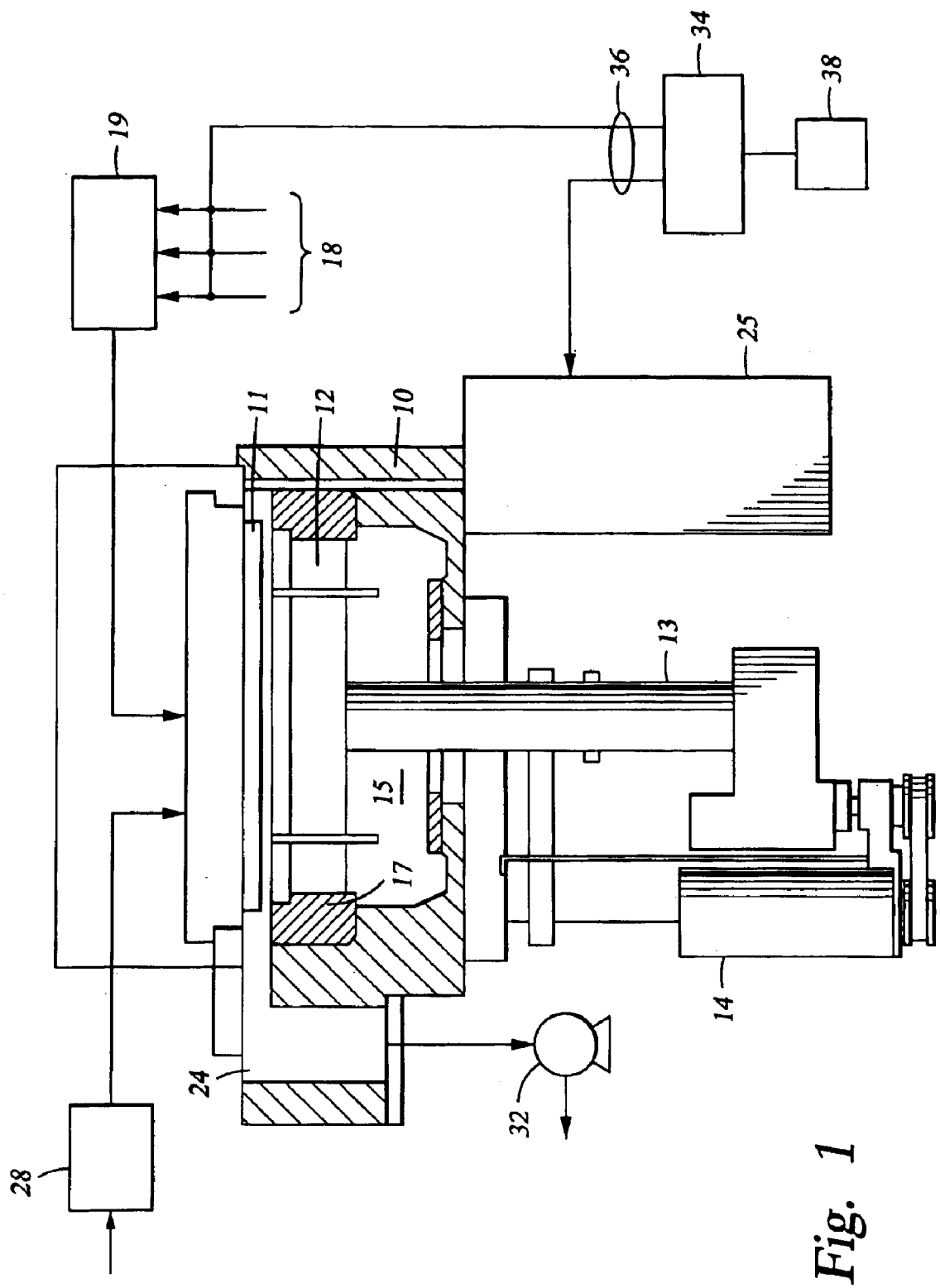
FIG. 1 is a a cross-sectional diagram of an exemplary CVD reactor configured for use according to embodiments described herein.

For a further understanding of the present invention, reference should be made to the ensuing detailed description.

DETAILED DESCRIPTION OF THE PREFERRED EMBODIMENT

The present invention is described by reference to a method and apparatus for depositing a silicon oxycarbide layer having a low dielectric constant, and depositing a silicon and carbon containing layer on the silicon oxycarbide layer. Surprisingly and unexpectedly, plasma enhanced deposition of a silicon and carbon containing layer on the silicon oxycarbide layer decreases the dielectric constant of the underlying silicon oxycarbide material, apparently by removing some of the carbon without shrinking or deforming the silicon oxycarbide layer.

The silicon oxycarbide layer is deposited by reacting an organosilicon compound to form a dielectric layer comprising carbon-silicon bonds and a dielectric constant less than about 3. The silicon oxycarbide layer can be deposited as a planar layer or as a gap fill dielectric layer between conductive materials prior to deposition of the silicon and carbon containing layer. The silicon and carbon containing layer is preferably a silicon carbide cap layer which may be doped with oxygen, nitrogen, or both.

The silicon oxycarbide layer contains carbon in silicon-carbon bonds which contributes to low dielectric constants and barrier properties. The remaining carbon content of the deposited film is between about 1% and about 50% by atomic weight, and is preferably between about 5% and about 50% by atomic weight. The deposited films may contain C—H or C—F bonds throughout to provide hydrophobic properties to the silicon oxycarbide layer. The inclusion of carbon-silicon bonds in the silicon oxycarbide film is believed to lower the dielectric constant to about 3 or less.

The silicon oxycarbide layers are produced from organosilicon compounds containing carbon in organo groups that are not readily removed by oxidation at processing conditions. Suitable organo groups include alkyl, alkenyl, cyclohexenyl, and aryl groups and functional derivatives. The organosilicon compounds include, for example:

| | |
|---|---|
| methylsilane, | $CH_3—SiH_3$ |
| dimethylsilane, | $(CH_3)_2—SiH_2$ |
| trimethylsilane, | $(CH_3)_3—SiH$ |
| tetramethylsilane, | $(CH_3)_4—Si$ |
| dimethylsilanediol, | $(CH_3)_2—Si—(OH)_2$ |
| ethylsilane, | $CH_3—CH_2—SiH_3$ |
| phenylsilane, | $C_6H_5—SiH_3$ |
| diphenylsilane, | $(C_6H_5)_2—SiH_2$ |
| diphenylsilanediol, | $(C_6H_5)_2—Si—(OH)_3$ |
| methylphenylsilane, | $C_6H_5—SiH_2—CH_3$ |
| disilanomethane, | $SiH_3—CH_2—SiH_3$ |
| bis(methylsilano)methane, | $CH_3—SiH_2—CH_2—SiH_2—CH_3$ |
| 1,2-disilanoethane, | $SiH_3—CH_2—CH_2—SiH_3$ |
| 1,2-bis(methylsilano)ethane, | $CH_3—SiH_2—CH_2—CH_2—SiH_2—CH_3$ |
| 2,2-disilanopropane, | $SiH_3—C(CH_3)_2—SiH_3$ |
| 1,3,5-trisilano-2,4,6-trimethylene, | $-(-SiH_2CH_2-)_3-$ (cyclic) |
| dimethyldimethoxysilane, | $(CH_3)_2—Si—(OCH_3)_2$ |
| diethyldiethoxysilane, | $(CH_3CH_2)_2—Si—(OCH_2CH_3)_2$ |
| dimethyldiethoxysilane, | $(CH_3)_2—Si—(OCH_2CH_3)_2$ |
| diethyldimethoxysilane, | $(CH_3CH_2)_2—Si—(OCH_3)_2$ |
| 1,3-dimethyldisiloxane, | $CH_3—SiH_2—O—SiH_2—CH_3$ |
| 1,1,3,3-tetramethyldisiloxane, | $(CH_3)_2—SiH—O—SiH—(CH_3)_2$ |
| hexamethyldisiloxane, | $(CH_3)_3—Si—O—Si—(CH_3)_3$ |
| 1,3-bis(silanomethylene)disiloxane, | $(SiH_3—CH_2—SiH_2-)_2O$ |
| bis(1-methyldisiloxanyl)methane, | $(CH_3—SiH_2—O—SiH_2-)_2CH_2$ |
| 2,2-bis(1-methyldisiloxanyl)propane, | $(CH_3—SiH_2—O—SiH_2-)_2C(CH_3)_2$ |
| 1,3,5,7-tetramethylcyclotetrasiloxane, | $(—SiHCH_3—O-)_4-$ (cyclic) |
| octamethylcyclotetrasiloxane, | $(—Si(CH_3)_2—O-)_4-$ (cyclic) |
| 1,3,5,7,9-pentamethylcyclopentasiloxane, | $(—SiHCH_3—O-)_5-$ (cyclic) |
| 1,3,5,7-tetrasilano-2,6-dioxy-4,8-dimethylene, | $(—SiH_2—CH_2—SiH_2—O-)_2-$ (cyclic) |
| 1,3,5-trisilanetetrahydropyran, | $—SiH_2—CH_2—SiH_2—CH_2—SiH_2—O—$ (cyclic) |

-continued

| | |
|---|---|
| 2,5-disilanetetrahydrofuran, and fluorinated derivatives thereof. | —SiH$_2$—CH$_2$—CH$_2$—SiH$_2$—O— (cyclic), |

In a preferred aspect of the invention, the silicon oxycarbide layer is deposited by reacting an organosilicon compound comprising three or more alkyl groups with an oxidizing gas comprising ozone. The silicon oxycarbide layer may be deposited without an oxidizer if the organosilicon compound includes oxygen. The preferred organosilicon compounds include:

| | |
|---|---|
| trimethylsilane, | (CH$_3$)$_3$—SiH |
| tetramethylsilane, | (CH$_3$)$_4$—Si |
| 1,1,3,3-tetramethyldisiloxane, | (CH$_3$)$_2$—SiH—O—SiH—(CH$_3$)$_2$ |
| hexamethyldisiloxane, | (CH$_3$)$_3$—Si—O—Si—(CH$_3$)$_3$ |
| 2,2-bis(1-methyldisiloxanyl)propane, | (CH$_3$—SiH$_2$—O—SiH$_2$)$_2$C(CH$_3$)$_2$ |
| 1,3,5,7-tetramethylcyclotetrasiloxane, | (—SiHCH$_3$—O—)$_4$ (cyclic) |
| octamethylcyclotetrasiloxane, | (—Si(CH$_3$)$_2$—O—)$_4$ (cyclic) |
| 1,3,5,7,9-pentamethylcyclopentasiloxane, and fluorinated derivatives thereof. | (—SiHCH$_3$—O—)$_5$ (cyclic) |

The most preferred organosilicon compound is trimethylsilane which is a preferred alkylsilane for making amorphous silicon carbide layers as described in more detail below.

The organosilicon compounds are oxidized during deposition of the silicon oxycarbide layer, preferably by reaction with oxygen (O$_2$), ozone (O$_3$), nitrous oxide (N$_2$O), carbon monoxide (CO), carbon dioxide (CO$_2$), water (H$_2$O), or combinations thereof. When ozone is used as an oxidizing gas, an ozone generator typically converts about 15 wt. % of the oxygen in a source gas to ozone, with the remainder typically being oxygen. However, the ozone concentration may be increased or decreased based upon the amount of ozone desired and the type of ozone generating equipment used. Organosilicon compounds that contain oxygen may be disassociated to provide the oxygen.

The organosilane compounds are oxidized during deposition such that the carbon content of the deposited film is between about 1% and about 50% by atomic weight, preferably about 5% and about 50%. During deposition of the silicon oxycarbide layer, the substrate is maintained at a temperature between about −20° C. and about 500° C., and preferably is maintained at a temperature between about 170° C. and about 180° C.

Following deposition, the deposited dielectric material can be annealed at a temperature between about 100° C. and about 400° C. for between about 1 minute and about 60 minutes, preferably at about 30 minutes, to reduce the moisture content and increase the solidity and hardness of the dielectric material, if desired. The anneal is preferably performed after the deposition of the next layer which prevents shrinkage or deformation of the dielectric layer. Inert gases, such as argon and helium, may be added to the annealing atmosphere.

For a plasma enhanced deposition of the silicon oxycarbide layer, the organosilicon material is deposited using a power density ranging between about 0.03 W/cm$^2$ and about 3.2 W/cm$^2$, which is a RF power level of between about 10 W and about 1000 W for a 200 mm substrate. The silicon oxycarbide layer can be deposited continuously or with interruptions, such as changing chambers or providing cooling time, to improve porosity. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

In one embodiment of plasma enhanced deposition, oxygen or oxygen containing compounds are dissociated to increase reactivity and achieve desired oxidation of the deposited film. RF power is coupled to the deposition chamber to increase dissociation of the compounds. The compounds may also be dissociated in a microwave chamber prior to entering the deposition chamber.

Although deposition preferably occurs in a single deposition chamber, the silicon oxycarbide layer can be deposited sequentially in two or more deposition chambers, e.g., to permit cooling of the film during deposition.

The silicon and carbon containing layer deposited on the silicon oxycarbide layer can include a silicon carbide material, an oxygen doped silicon carbide material, a nitrogen doped silicon carbide material, or combinations thereof. The silicon and carbon containing layer is preferably an amorphous hydrogenated silicon carbide. The amorphous silicon carbide layer is produced by the reaction of an alkysilane compound, or a carbon containing material and a silicon containing material, in a plasma of an inert gas. Oxygen or a nitrogen source, such as ammonia, may also be present during the reaction to form the doped silicon carbide layers.

Suitable alkylsilane compounds for depositing the silicon carbide layers include:

| | |
|---|---|
| methylsilane | (CH$_3$SiH$_3$) |
| dimethysilane | ((CH$_3$)$_2$SiH$_2$), |
| trimethylsilane | ((CH$_3$)$_3$SiH), |
| diethylsilane | ((C$_2$H$_5$)$_2$SiH$_2$), |
| propylsilane | (C$_3$H$_7$SiH$_3$), |
| vinylmethylsilane | (CH$_2$=CH)CH$_3$SiH$_2$), |
| 1,1,2,2-tetramethyldisilane | (HSi(CH$_3$)$_2$—Si(CH$_3$)$_2$H), |
| hexamethyldisilane | ((CH$_3$)$_3$Si—Si(CH$_3$)$_3$), |
| 1,1,2,2,3,3-hexamethyltrisilane | (H(CH$_3$)$_2$Si—Si(CH$_3$)$_2$—SiH(CH$_3$)$_2$), |
| 1,1,2,3,3-pentamethyltrisilane | (H(CH$_3$)$_2$Si—SiH(CH$_3$)—SiH(CH$_3$)$_2$), |
| dimethyldisilanoethane | (CH$_3$—SiH$_2$—(CH$_2$)$_2$—SiH$_2$—CH$_3$), |
| dimethyldisilanopropane | (CH$_3$—SiH—(CH$_2$)$_3$—SiH—CH$_3$), |
| tetramethyldisilanoethane | ((CH)$_2$—SiH—(CH$_2$)$_2$—SiH—(CH)$_2$), |
| tetramethyldisilanopropane | ((CH$_3$)$_2$—Si—(CH$_2$)$_3$—Si—(CH$_3$)$_2$), |
| and fluorinated carbon derivatives thereof. | |

The alkylsilane compounds are reacted in a plasma comprising a relatively inert gas, preferably a noble gas, such as helium or argon, or nitrogen (N$_2$). The deposited silicon carbide films have dielectric constants of about 6 or less, and preferably have dielectric constants of about 3 or less. Depositing the silicon carbide layers reduces the dielectric constant of the silicon oxycarbide layer to less than about 2.4.

A preferred silicon carbide layer is deposited in one embodiment by supplying trimethylsilane to a plasma processing chamber at a flow rate between about 10 and about 1000 standard cubic centimeters per minute (sccm). An inert gas, such as helium, argon, or combinations thereof, is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process. Alternatively, a doped silicon carbide layer can be deposited by introducing oxygen and/or a nitrogen source, or other dopant, into the processing chamber at a flow rate between about 50 sccm and about 10,000 sccm.

The organosilicon compound, inert gas, and optional dopant, are introduced to the processing chamber via a gas distribution plate spaced between about 200 millimeters (mm) and about 600 millimeters from the substrate on which the silicon carbide layer is being deposited upon. Power from a single 13.56 MHz RF power source is supplied to the chamber 10 to form the plasma at a power density between about 0.3 watts/cm$^2$ and about 3.2 watts/cm$^2$, or a power level between about 100 watts and about 1000 watts for a 200 mm substrate. A power density between about 0.9 watts/cm$^2$ and about 2.3 watts/cm$^2$, or a power level between about 300 watts and about 700 watts for a 200 mm substrate, is preferably supplied to the processing chamber to generate the plasma. Additionally, the ratio of the silicon source to the dopant in the gas mixture should have a range between about 1:1 and about 1:100. The above process parameters provide a deposition rate for the silicon carbide layer in a range between about 100 Å/min and about 3000 Å/min when implemented on a 200 mm (millimeter) substrate in a deposition chamber available from Applied Materials, Inc., located in Santa Clara, Calif.

Processes for depositing silicon carbide layers with low dielectric constants are more fully described in co-pending U.S. patent application Ser. No. 09/165,248, filed Oct. 1, 1998, in co-pending U.S. patent application Ser. No. 09/270,039, filed Mar. 16, 1999, and in co-pending U.S. patent application Ser. No. 09/627,667, filed Jul. 28, 2000, which descriptions are incorporated by reference herein to the extent not inconsistent with the invention. The embodiments described herein for depositing silicon carbide layers are provided to illustrate the invention, the particular embodiment shown should not be used to limit the scope of the invention. The invention also contemplates other processes and materials used to deposit silicon carbide layers.

The deposition process of the present invention can be performed in a substrate processing system as described in more detail below.

Exemplary CVD Reactor

FIG. 1 shows a vertical, cross-section view of a parallel plate chemical vapor deposition processing chamber 10 having a high vacuum region 15. The processing chamber 10 contains a gas distribution manifold 11 for dispersing process gases through perforated holes in the manifold to a substrate or substrate (not shown) that rests on a substrate support plate or susceptor 12 which is raised or lowered by a lift motor 14. A liquid injection system (not shown), such as typically used for liquid injection of TEOS, may also be provided for injecting a liquid organosilicon compound.

The processing chamber 10 includes heating of the process gases and substrate, such as by resistive heating coils (not shown) or external lamps (not shown). Referring to FIG. 1, susceptor 12 is mounted on a support stem 13 so that susceptor 12 (and the substrate supported on the upper surface of susceptor 12) can be controllably moved between a lower loading/off-loading position and an upper processing position which is closely adjacent to manifold 11.

When susceptor 12 and the substrate are in processing position, they are surrounded by an insulator 17 and process gases exhaust into a manifold 24. During processing, gases inlet to manifold 11 are uniformly distributed radially across the surface of the substrate. A vacuum pump 32 having a throttle valve controls the exhaust rate of gases from the chamber.

Before reaching manifold 11, deposition and carrier gases are input through gas lines 18 into a mixing system 19 where they are combined and then sent to manifold 11. Generally, the process gases supply line 18 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in processing chamber 10 can be either a thermal process or a plasma enhanced process. In a plasma process, a controlled plasma is typically formed adjacent to the substrate by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12. The silicon oxycarbide layers of the present invention are most preferably produced using low levels of constant high frequency RF power or pulsed levels of high frequency RF power.

When additional dissociation of the oxidizing gas is desired, an optional microwave chamber 28 can be used to input from between about 0 Watts and about 6000 Watts of microwave power to the oxidizing gas prior to entering the deposition chamber. Separate addition of microwave power would avoid excessive dissociation of the organosilicon compounds prior to reaction with the oxidizing gas. A gas distribution plate having separate passages for the organosilicon compound and the oxidizing gas is preferred when microwave power is added to the oxidizing gas.

Typically, any or all of the chamber lining, distribution manifold 11, susceptor 12, and various other reactor hardware is made out of material such as aluminum or anodized aluminum. An example of such a CVD reactor is described in U.S. Pat. No. 5,000,113, entitled A Thermal CVD/PECVD Reactor and Use for Thermal Chemical Vapor Deposition of Silicon Dioxide and in-situ Multi-step Planarized Process, issued to Wang et al. and assigned to Applied Materials, Inc., the assignee of the present invention.

The lift motor 14 raises and lowers susceptor 12 between a processing position and a lower, substrate-loading position. The motor, the gas mixing system 19, and the RF power supply 25 are controlled by a system controller 34 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

The system controller 34 operates under the control of a computer program stored on the hard disk drive 38. The computer program dictates the timing, mixture of gases, RF power levels, susceptor position, and other parameters of a particular process.

Figure 2:
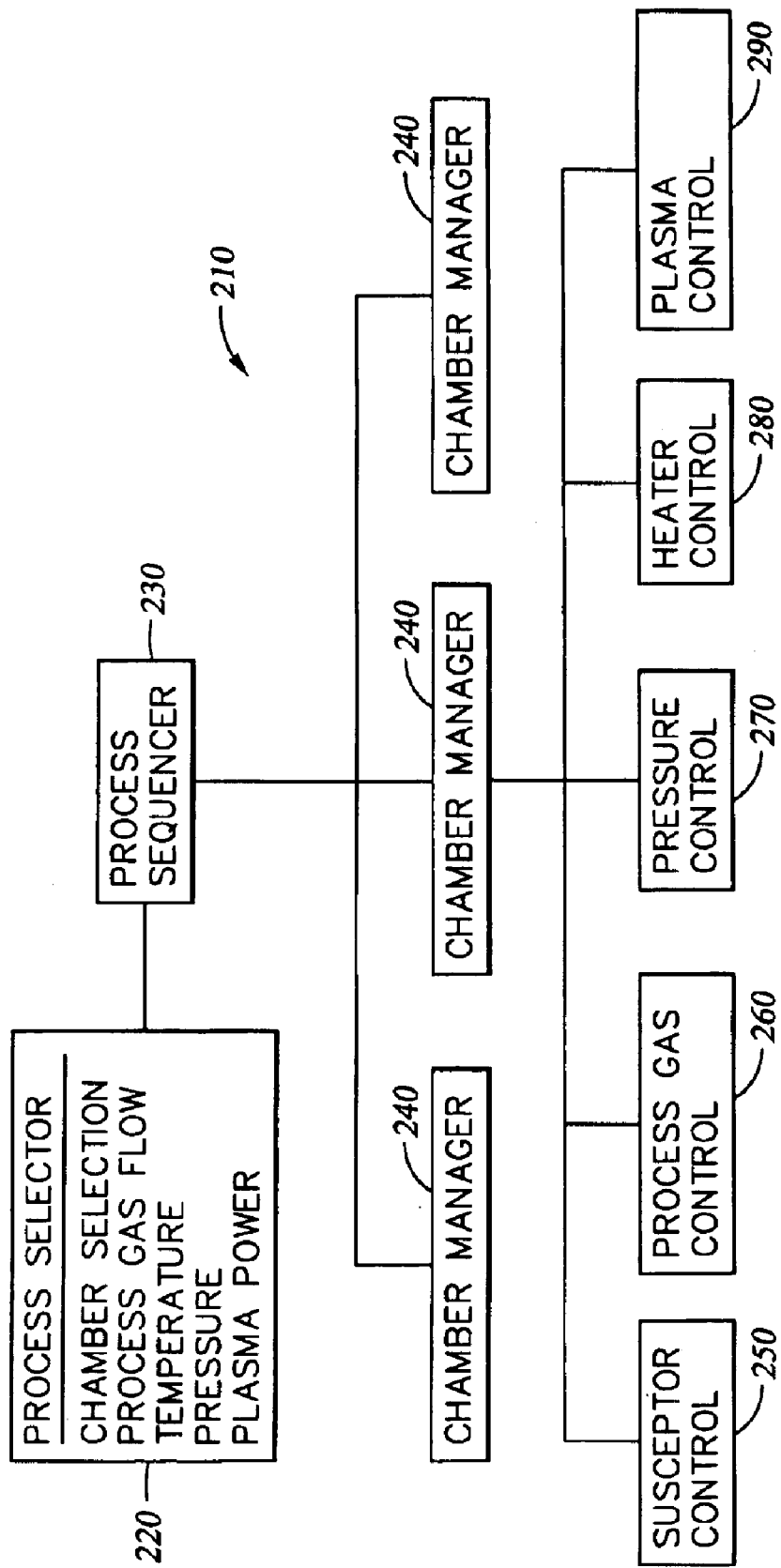
FIG. 2 is a flow chart of a process control computer program product used in conjunction with the exemplary CVD reactor of FIG. 1.

Referring to FIG. 2, the process can be implemented using a computer program product 210 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 2 shows an illustrative block diagram of the hierarchical control structure of the computer program 210. A user enters a process set number and process chamber number into a process selector subroutine 220 in response to menus or screens displayed on the CRT monitor by using the light pen interface. The process sets are predetermined sets of process parameters necessary to carry out specified processes, and are identified by predefined set numbers. The process selector subroutine 220 the (i) selects a desired process chamber on a cluster tool such as an Centura® platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 230 comprises program code for accepting the identified process chamber and set of process parameters from the process selector subroutine 220, and for controlling operation of the various process chambers. Multiple users can enter process set numbers and process chamber numbers, or a user can enter multiple process chamber numbers, so the sequencer subroutine 230 operates to schedule the selected processes in the desired sequence. Preferably the sequencer subroutine 230 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 230 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 230 determines which process chamber and process set combination is going to be executed next, the sequencer subroutine 230 causes execution of the process set by passing the particular process set parameters to a chamber manager subroutine 240 which controls multiple processing tasks in a process chamber 10 according to the process set determined by the sequencer subroutine 230. For example, the chamber manager subroutine 240 comprises program code for controlling CVD process operations in the process chamber 10. The chamber manager subroutine 240 also controls execution of various chamber component subroutines which control operation of the chamber component necessary to carry out the selected process set. Examples of chamber component subroutines are susceptor control subroutine 250, process gas control subroutine 260, pressure control subroutine 270, heater control subroutine 280, and plasma control subroutine 290. Those having ordinary skill in the art would readily recognize that other chamber control subroutines can be included depending on what processes are desired to be performed in the processing chamber 10.

In operation, the chamber manager subroutine 240 selectively schedules or calls the process component subroutines in accordance with the particular process set being executed. The chamber manager subroutine 240 schedules the process component subroutines similarly to how the sequencer subroutine 230 schedules which process chamber 10 and process set is to be executed next. Typically, the chamber manager subroutine 240 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 250 comprises program code for controlling chamber components that are used to load the substrate onto the susceptor 12, and optionally to lift the substrate to a desired height in the processing chamber 10 to control the spacing between the substrate and the gas distribution manifold 11. When a substrate is loaded into the processing chamber 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 250 controls movement of the susceptor 12 in response to process set parameters that are transferred from the chamber manager subroutine 240.

The process gas control subroutine 260 has program code for controlling process gas composition and flow rates. The process gas control subroutine 260 controls the open/close position of the safety shut-off valves, and also ramps up/down the mass flow controllers to obtain the desired gas flow rate. The process gas control subroutine 260 is invoked by the chamber manager subroutine 240, as are all chamber components subroutines, and receives from the chamber manager subroutine process parameters related to the desired gas flow rates. Typically, the process gas control subroutine 260 operates by opening the gas supply lines, and repeatedly (i) reading the necessary mass flow controllers, (ii) comparing the readings to the desired flow rates received from the chamber manager subroutine 240, and (iii) adjusting the flow rates of the gas supply lines as necessary. Furthermore, the process gas control subroutine 260 includes steps for monitoring the gas flow rates for unsafe rates, and activating the safety shut-off valves when an unsafe condition is detected.

In some processes, an inert gas such as helium or argon is flowed into the processing chamber 10 to stabilize the pressure in the chamber before reactive process gases are introduced into the chamber. For these processes, the process gas control subroutine 260 is programmed to include steps for flowing the inert gas into the chamber 10 for an amount of time necessary to stabilize the pressure in the chamber, and then the steps described above would be carried out. Additionally, when a process gas is to be vaporized from a liquid precursor, for example 1,3,5-trisilano-2,4,6-trimethylene (1,3,5-trisilanacyclohexane), the process gas control subroutine 260 would be written to include steps for bubbling a delivery gas such as helium through the liquid precursor in a bubbler assembly. For this type of process, the process gas control subroutine 260 regulates the flow of the delivery gas, the pressure in the bubbler, and the bubbler temperature in order to obtain the desired process gas flow rates. As discussed above, the desired process gas flow rates are transferred to the process gas control subroutine 260 as process parameters. Furthermore, the process gas control subroutine 260 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 270 comprises program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 270 is invoked, the desired, or target pressure level is received as a parameter from the chamber manager subroutine 240. The pressure control subroutine 270 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 270 can be written to open or close the throttle valve to a particular opening size to regulate the processing chamber 10 to the desired pressure.

The heater control subroutine 280 comprises program code for controlling the temperature of the heat modules or radiated heat that is used to heat the susceptor 12. The heater control subroutine 280 is also invoked by the chamber manager subroutine 240 and receives a target, or set point, temperature parameter. The heater control subroutine 280 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 280 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 290 comprises program code for setting the RF bias voltage power level applied to the process electrodes in the processing chamber 10, and optionally, to set the level of the magnetic field generated in the reactor. Similar to the previously described chamber component subroutines, the plasma control subroutine 290 is invoked by the chamber manager subroutine 240.

The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor. The pretreatment and method for forming a pretreated layer of the present invention is not limited to any specific apparatus or to any specific plasma excitation method.

Deposition of Silicon Oxycarbide Layer and Silicon Carbide Materials.

Figure 3:
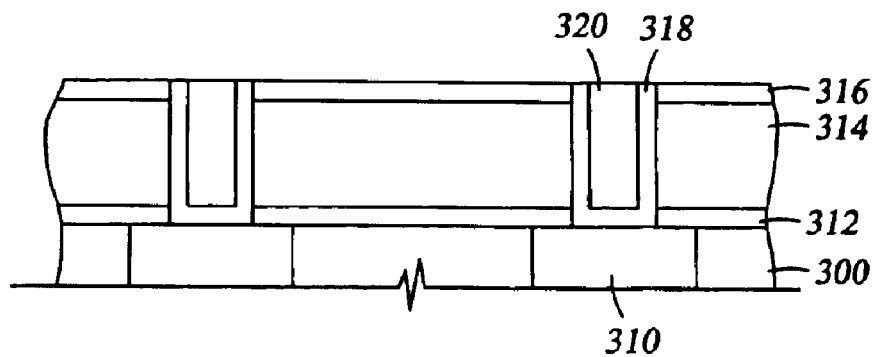
FIG. 3 is a cross sectional view showing a damascene structure comprising a silicon oxycarbide layer and a silicon carbide cap layer described herein.

A damascene structure which includes a silicon oxycarbide layer and a silicon carbide layer or doped silicon carbide layer deposited thereon is shown in FIG. 3. Conductive features 310 are disposed in substrate 300. Silicon oxycarbide is deposited as a dielectric layer 314 on a dielectric liner or barrier layer 312 of silicon carbide as described herein. The liner or barrier layer may alternatively comprise other dielectric liner and barrier materials such as silicon nitride. Silicon carbide is deposited as described herein as a cap layer 316 on the dielectric layer 314. The cap layer 316 may perform as an etch stop during further substrate processing or as a liner layer. The cap layer 316, dielectric layer 314, and dielectric liner or barrier layer 312 are pattern etched to define the openings of interconnects 317 such as lines that expose the underlying conducive features 310. A conductive liner/barrier layer 318 is deposited within the interconnects 317, and a conductive material 320 is deposited thereon to fill the interconnects 317. The substrate is typically planarized as shown after deposition.

Figure 4A:
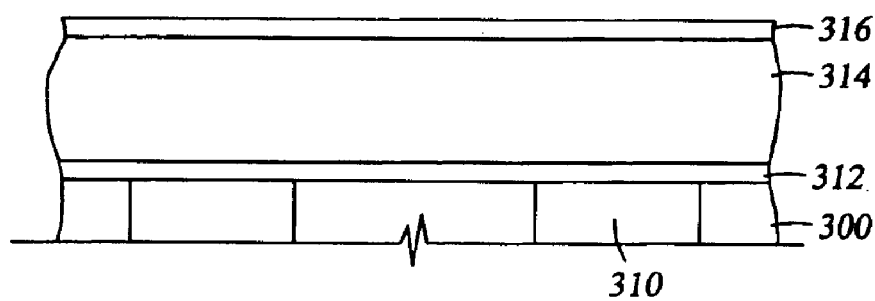
FIGS. 4A–4C are cross sectional views showing one embodiment of a damascene deposition sequence.
Figure 4B:
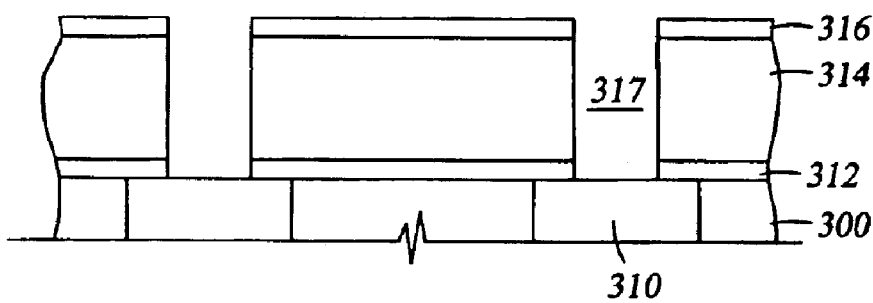
Figure 4C:
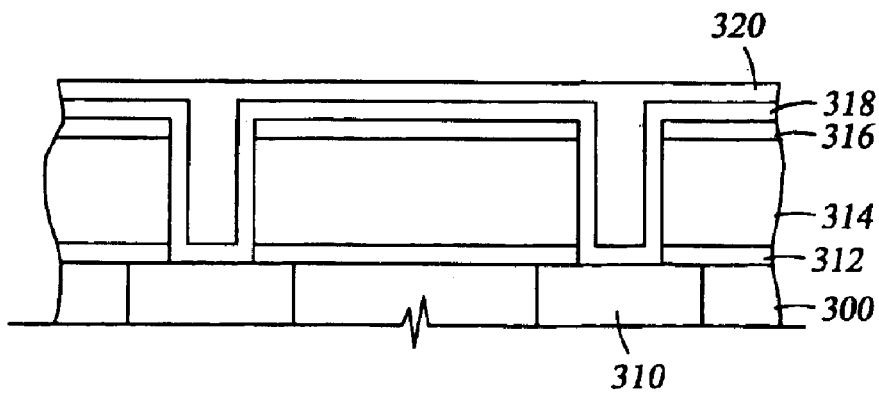

A preferred damascene structure fabricated in accordance with the invention includes a silicon oxycarbide layer and a silicon carbide layer as shown in FIG. 3, and the method of making the structure is sequentially depicted schematically in FIGS. 4A–4C, which are cross sectional views of a substrate having the steps of the invention formed thereon.

As shown in FIG. 4A, a dielectric layer 314 of a silicon oxycarbide material formed from one or more organosilicon compounds using the deposition processes described herein is deposited on the liner or barrier layer 312 to a thickness between about 5,000 Å to about 10,000 Å, depending on the size of the structure to be fabricated. The dielectric layer 314 may be deposited in a plasma enhanced deposition process, but is preferably deposited in a plasma-free deposition process by reacting trimethylsilane with oxygen comprising about 15 wt % ozone.

The liner or barrier layer 312 may be a silicon carbide layer from the PECVD of an alkylsilane compound using a plasma of a inert gas. The silicon carbide layer which may be doped with oxygen or nitrogen. The liner/barrier layer 312 may alternatively comprise another material, such as silicon nitride, which minimizes oxidation and/or diffusion of conductive materials, such as copper, which may comprise conductive features 310 previously formed in the substrate 300.

The cap layer 316, which includes a silicon carbide layer or doped silicon carbide layer described herein, is then deposited on the dielectric layer 314 by reaction of the trimethylsilane to a thickness of about 200 to about 1000 Å using RF power in the range between about 10 and about 1000 watts for a 200 mm substrate. The silicon carbide material may be doped with oxygen or nitrogen.

As shown in FIG. 4B, the cap layer 316, the dielectric layer 314, and the liner or barrier layer 312 are then pattern etched to define the interconnects 317 and to expose the conductive feature 310 in substrate 300. Preferably, the cap layer 316, the dielectric layer 314, and the liner or barrier layer 312 are pattern etched using conventional photolithography and etch processes for silicon carbide films. Any photo resist or other material used to pattern the cap layer 316 is removed using an oxygen strip or other suitable process.

Following etching of the deposited material and removal of photo resist materials, exposed portions of the cap layer 316, the dielectric layer 314, and the liner or barrier layer 312 may be treated with a reactive pre-clean process to remove contaminants, particulate matter, residues, and oxides that may have formed on the exposed portions of the interconnects 317 and on the surface of the substrate. The reactive pre-clean process comprises exposing the substrate to a plasma, preferably comprising hydrogen and/or an inert gas, such as argon, at a power density between of 0.03 watts/cm$^2$ and about 3.2 watts/cm$^2$, or at a power level between about 10 watts and 1000 for a 200 millimeter substrate. The processing chamber is maintained at a pressure of about 20 Torr or less and at a substrate temperature of about 450° C. or less during the reactive clean process.

Referring to FIG. 4C, after the cap layer 316, the dielectric layer 314, and the liner or barrier layer 312 have been etched to define the interconnects 317 and the photo resist has been removed, the interconnects 317 are filled with conductive materials 320. The structure is preferably formed with a conductive material such as aluminum, copper, tungsten or combinations thereof with a conductive barrier layer to prevent diffusion. Presently, the trend is to use copper to form the smaller features due to the low resistivity of copper (1.7 Ω-cm compared to 3.1 Ω-cm for aluminum).

Preferably, the conductive barrier layer 318 is first deposited conformally in the interconnects 317 to prevent copper migration into the surrounding silicon and/or dielectric material. Barrier layers include titanium, titanium nitride, tantalum, tantalum nitride, and combinations thereof among other conventional barrier layer materials. Thereafter, copper 320 is deposited using chemical vapor deposition, physical vapor deposition, electroplating, or combinations thereof, to form the conductive structure. Once the structure has been filled with copper or other conductive material, the surface is planarized using chemical mechanical polishing to produce the finished damascene structure shown in FIG. 3.

Figure 5:
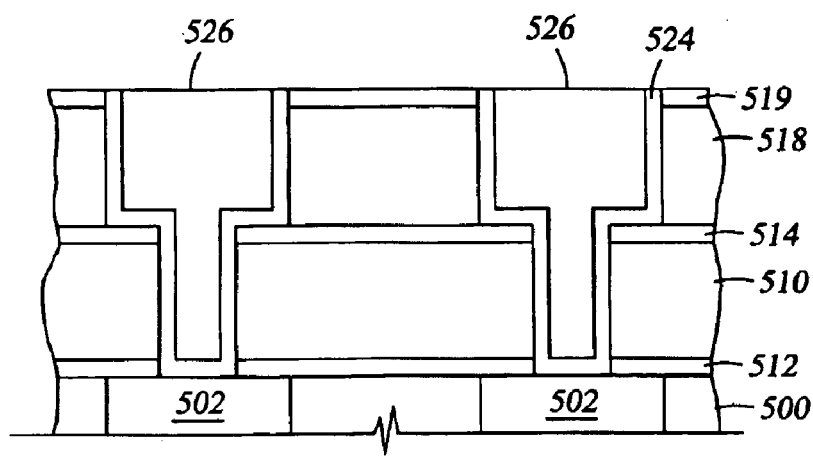
FIG. 5 is a cross sectional view showing a dual damascene structure comprising two silicon oxycarbide layers and two silicon carbide cap layers described herein.

A dual damascene structure which includes two silicon oxycarbide layers and two silicon carbide cap layers or doped silicon carbide cap layers deposited thereon is shown in FIG. 5. A conductive feature 502 is disposed in substrate 500. The first silicon oxycarbide layer is deposited as a first dielectric layer 510 on a liner or barrier layer 512, for example a silicon carbide as described herein. A first silicon carbide cap layer 514 is deposited on the first dielectric layer 510 as described herein. The silicon carbide cap layer 514 reduces the dielectric constant of the silicon oxycarbide layer and is pattern etched to define the openings of vertical interconnects such as contacts/vias. For the dual damascene application, a second dielectric layer 518 comprising the second silicon oxycarbide layer is deposited over the patterned silicon carbide cap layer 514. The second silicon carbide cap layer 519 is deposited on the second dielectric layer 518 and pattern etched to define horizontal interconnects such as lines. An etch process is performed to define the horizontal interconnects down to the first silicon carbide layer 514 which functions as an etch stop, and to define the vertical interconnects and expose the conductive feature 502 in substrate 500 prior to filling the interconnects with a conductive material 526.

A preferred method for making the dual damascene structure shown in FIG. 5 is sequentially depicted in FIGS. 6A–6G, which are cross sectional views of a substrate having the steps of the invention formed thereon.

Figure 6A:
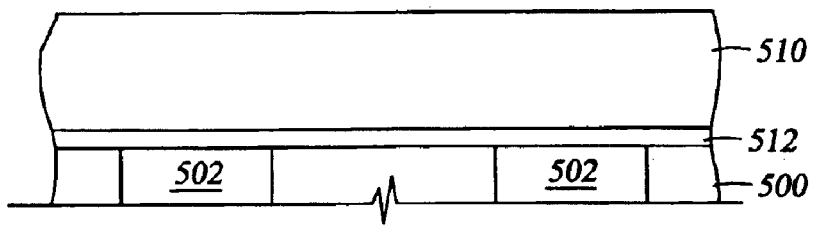
FIGS. 6A–6G are cross sectional views showing one embodiment of a dual damascene deposition sequence.

As shown in FIG. 6A, an initial first dielectric layer 510 of a silicon oxycarbide material from the organosilicon compounds and deposition processes described herein is deposited on the liner or barrier layer 512 to a thickness between about 5,000 Å and about 10,000 Å, depending on the size of the structure to be fabricated. The first dielectric layer 510 may be deposited in a plasma enhanced deposition process, but is preferably deposited in a plasma-free deposition process by reacting trimethylsilane with oxygen comprising about 15 wt % ozone. The liner layer 512 may be a silicon carbide layer which may be doped with oxygen or nitrogen. The liner/barrier layer 512 may alternatively comprise another material, such as silicon nitride, which minimizes oxidation and/or diffusion of conductive materials, such as copper, which may comprise conductive features 502 previously formed in the substrate 500.

Figure 6B:
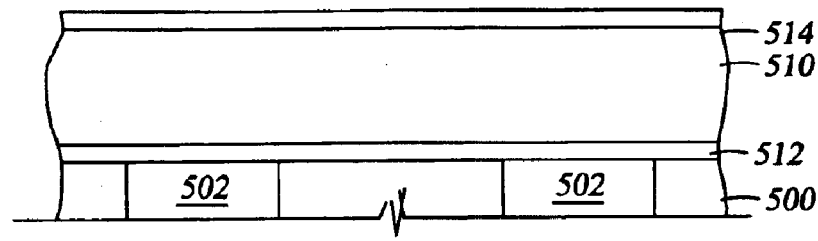
Figure 6C:
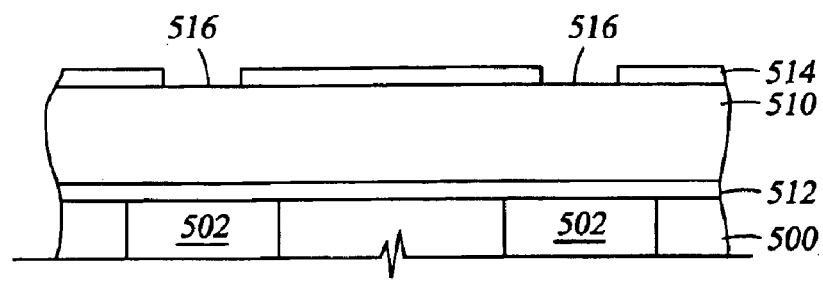

As shown in FIG. 6B, the first cap layer 514, which includes a silicon carbide layer or doped silicon carbide layer described herein, is then deposited on the first dielectric layer by reaction of the trimethylsilane to a thickness between about 200 and about 1000 Å using RF power in the range between about 10 and about 1000 watts for a 200 mm substrate. The first cap layer 514 is then pattern etched to define the contact/via openings 516 and to expose first dielectric layer 510 in the areas where the contacts/vias are to be formed as shown in FIG. 6C. Preferably, the first cap layer 514 is pattern etched using conventional photolithography and etch processes for silicon carbide films.

Figure 6D:
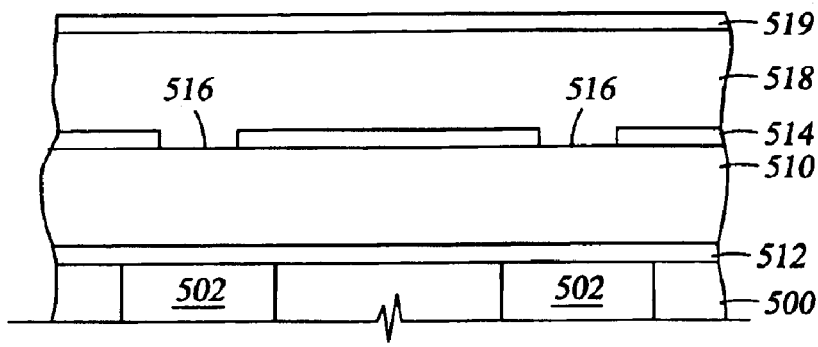

After the first cap layer 514 has been etched to pattern the contacts/vias 516 and the photo resist has been removed, a second dielectric layer 518 is deposited over the first cap layer 514 to a thickness between about 5,000 Å and about 10,000 Å as described for the first dielectric layer 510 as shown in FIG. 6D.

Figure 6E:
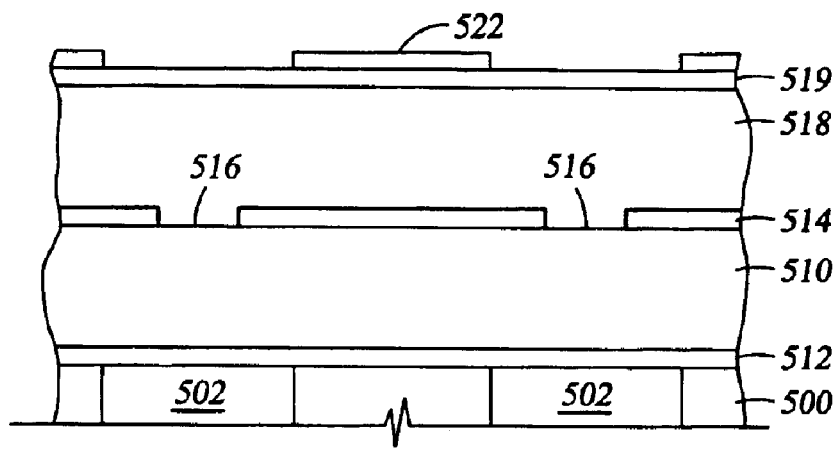
Figure 6F:
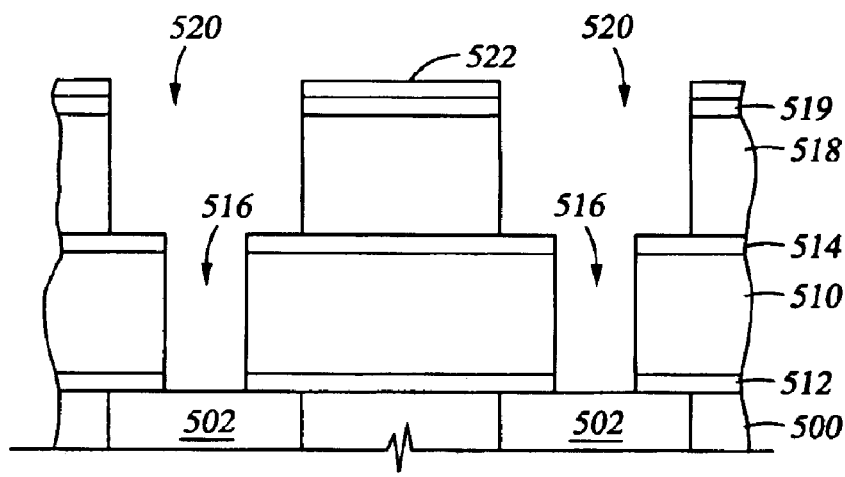

A second cap layer 519, which includes a silicon carbide layer or doped silicon carbide layer described herein, is then deposited on the second dielectric layer 518 as described for the first cap layer 514 to a thickness of about 200 to about 1000 Å. The silicon carbide material may be doped with oxygen or nitrogen. The second cap layer 519 is then patterned to define lines 520, as described for the first cap layer 514 as shown in FIG. 6E. The lines 520 and contacts/vias 516 are then etched using reactive ion etching or other anisotropic etching techniques to define the metallization structure (i.e., the openings for the lines and contact/via) and expose the conductive feature 502 as shown in FIG. 6F. Any photo resist or other material used to pattern and etch the second cap layer 519 is removed using an oxygen strip or other suitable process.

Following etching of the deposited material and removal of photo resist materials, exposed portions of the second cap layer 519, the second dielectric layer 518, the first cap layer 514, the first dielectric layer 510, and the liner or barrier layer 512 may be treated with a reactive pre-clean process to remove contaminants, particulate matter, residues, and oxides that may have formed on the exposed portions of the contact/via openings 516, the line openings 520, and the conductive feature 502. The reactive pre-clean process comprises exposing the substrate to a plasma, preferably comprising hydrogen and/or an inert gas, such as argon, at a power density between of 0.03 watts/cm$^2$ and about 3.2 watts/cm$^2$, or at a power level between about 10 watts and 1000 for a 200 millimeter substrate. The processing chamber is maintained at a pressure of about 20 Torr or less and at a substrate temperature of about 450° C. or less during the reactive clean process.

Figure 6G:
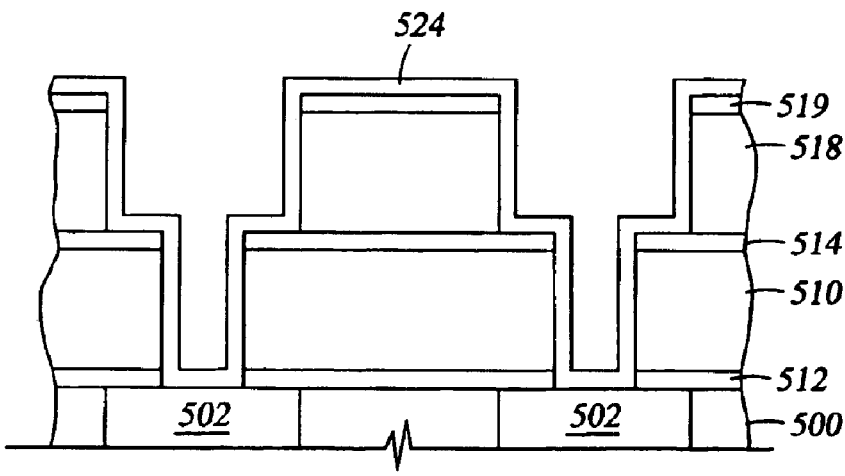

The metallization structure is then formed with a conductive material such as aluminum, copper, tungsten or combinations thereof. Presently, the trend is to use copper to form the smaller features due to the low resistivity of copper (1.7 Ω-cm compared to 5.1 Ω-cm for aluminum). Preferably, as shown in FIG. 6G, a conductive barrier layer 524 is first deposited conformally in the metallization pattern to prevent copper migration into the surrounding silicon and/or dielectric material. Barrier layers include titanium, titanium nitride, tantalum, tantalum nitride, and combinations thereof among other conventional barrier layer materials. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing as shown in FIG. 5.

Figure 7:
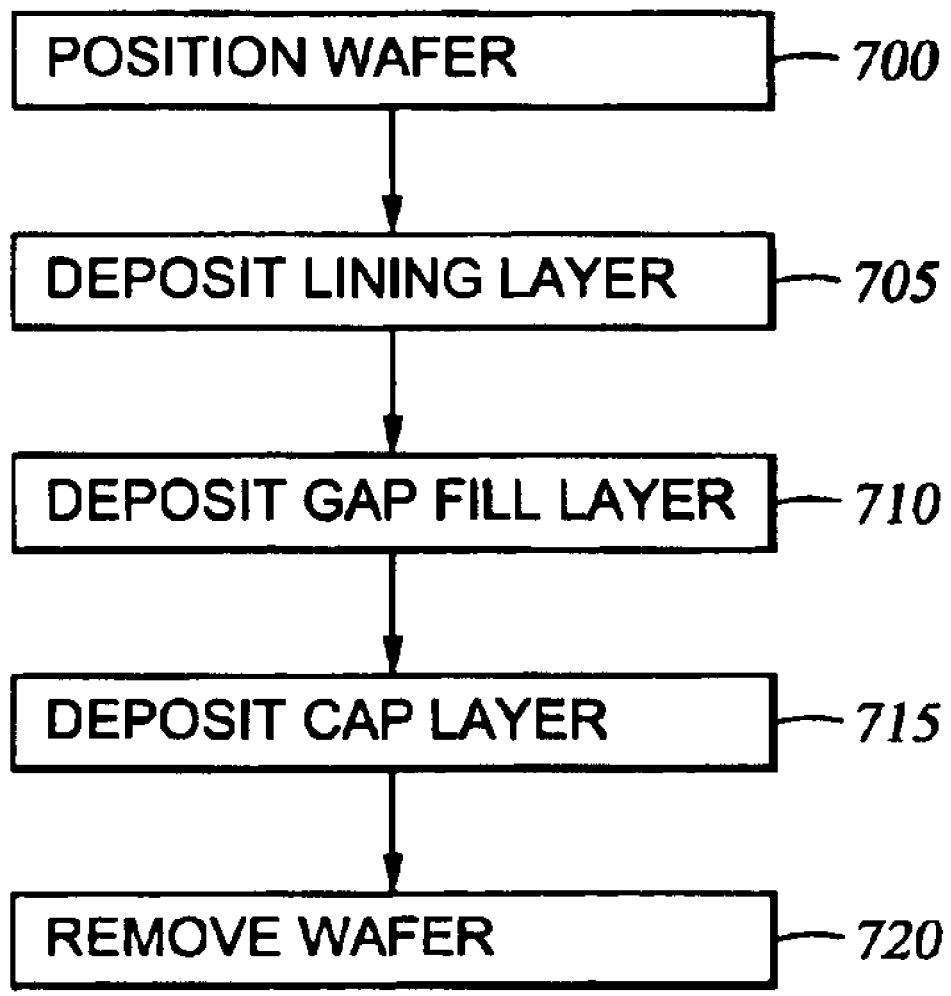
FIG. 7 is a flow chart illustrating steps undertaken in depositing a silicon oxycarbide layer and a silicon carbide cap layer in a gap filling process according to another embodiment described herein.

The silicon oxycarbide layer and the silicon and carbon containing materials described herein can be used in a gap filling process as shown in FIG. 7 using the CVD chamber described above and shown in FIG. 1. Referring to FIG. 7, a substrate is positioned 700 in the processing chamber 10 and a silicon carbide liner layer is deposited 705 by a CVD or plasma enhanced CVD process from the reaction of an alkylsilane compound described above, such as trimethylsilane. The deposition step 705 can include a capacitively coupled plasma or both an inductively and a capacitively coupled plasma in the process chamber 10.

A silicon oxycarbide gap fill layer is then deposited 710 on the liner layer by reacting an organosilicon compound such as trimethylsilane with an oxidizer such as a combination of oxygen and ozone. The gap fill layer may then be annealed in an inert atmosphere for a period of time as needed to remove moisture and solidify the deposited material. A silicon carbide cap layer is then deposited 715 on the gap fill layer using a plasma enhanced CVD process from the reaction of an alkylsilane compound described above, such as trimethylsilane, in the plasma of a relatively inert gas. The substrate is then removed 720 from the processing chamber 10.

Referring to one embodiment in FIGS. 8A–8E, the three-layer gap filling process provides a PECVD lining layer 800 by reaction of an alkylsilane compound such as trimethylsilane to produce an amorphous hydrogenated silicon carbide layer as described herein. The lining layer 800 acts as an isolation layer between a subsequent organosilicon gap fill layer 802 and the underlying substrate surface 804 and metal lines 806, 808, 810 formed on the substrate surface. The gap fill layer 802 is capped by a capping layer 812 of the amorphous hydrogenated silicon carbide layer. This process is implemented and controlled using a computer program stored in the memory 38 of a computer controller 34 for a CVD processing chamber 10.

Figure 8A:
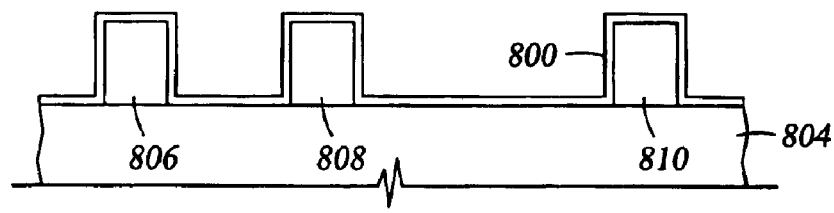
FIGS. 8A–8E is a schematic diagram of the layers deposited on a substrate by the process of FIG. 7.

Referring to FIG. 8A, in one embodiment, the PECVD lining layer 800 is deposited in the processing chamber 10 by introducing an organosilane compound such as trimethylsilane $(CH_3)_3SiH$, and generating a plasma of an inert gas, such as helium or argon. One exemplary processing regime includes introducing trimethylsilane to a processing chamber at a flow rate between about 30 sccm and 500 sccm, introducing helium, argon, or combinations thereof into the processing chamber at a rate between about 100 sccm and about 2000 sccm, maintaining a chamber pressure between about 3 Torr and about 10 Torr, maintaining a substrate surface temperature between about 200° C. and about 400° C., and supplying between about 300 watts and 700 watts to the chamber to generate the plasma of the processing gas. The gas distribution plate 11 is spaced between about 300 mm and about 600 mm from the substrate.

Figure 8B:
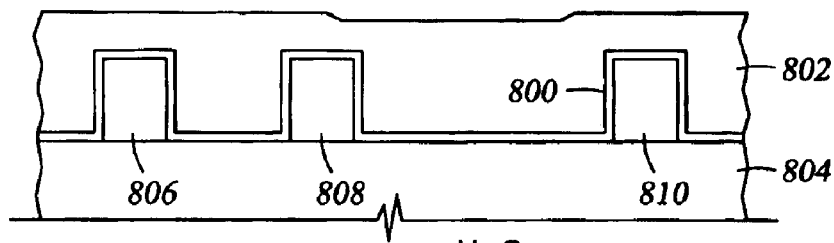
Figure 8C:
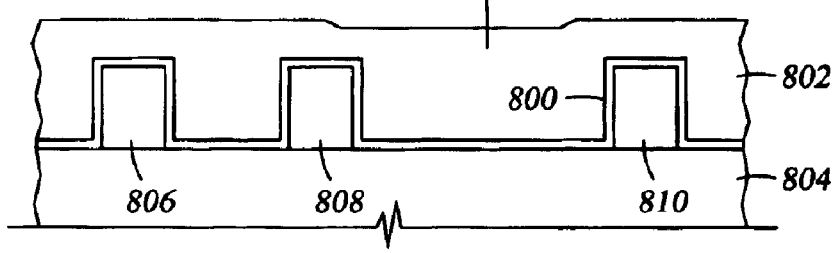
Figure 8D:
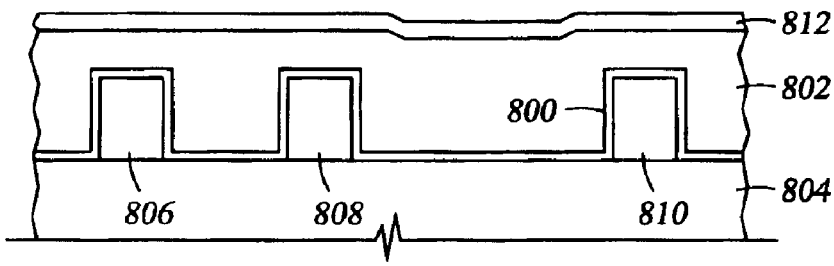

Referring to FIG. 8B, the gap filling layer 802 is deposited using alkylsilane compounds as described herein. Preferred process gases for the gap filling layer 802 are trimethylsilane $(CH_3)_3SiH$ and ozone, $O_3$. In one embodiment, the deposition process includes introducing trimethylsilane at a flow rate between about 50 sccm and about 500 sccm, preferably at about 175 sccm, introducing a mixture of oxygen and ozone, where ozone comprises about 15 wt. % of the mixture, at a flow rate between about 2000 sccm and about 6000 sccm, preferably at about 5000 sccm, reacting the trimethylsilane $(CH_3)_3SiH$ and $O_3$, maintaining a chamber pressure between about 50 Torr and about 500 Torr, preferably at about 100 Torr, during deposition of the gap filling layer 802. The gap fill layer 802 may be partially cured or annealed as shown in FIG. 8C to remove solvents such as water prior to deposition of a cap layer 812 as shown in FIG. 8D. Curing is done in the processing chamber 10 by pumping under a relatively inert gas atmosphere, such as a noble gas or nitrogen, under 10 Torr at a temperature of about 400° C. for about 30 minutes.

Figure 8E:
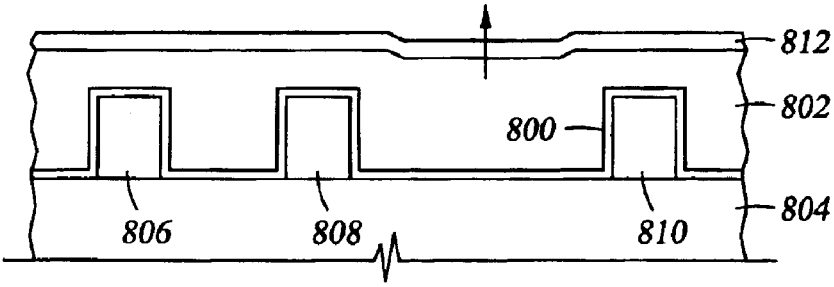

Referring to FIG. 8D, after deposition of the PECVD gap filling layer 802, a capping layer 812 of amorphous hydrogenated silicon carbide is deposited thereon by the plasma processes described herein. Referring to FIG. 8E, after deposition of the capping layer, if any, the gap fill layer 802 is preferably annealed in a furnace or another chamber at a temperature between about 100° C. and about 450° C. to remove moisture and other solvents. Of course, processing conditions will vary according to the desired characteristics of the deposited films.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
    reacting an organosilicon compound with carbon dioxide and one or more oxidizing gases selected from the group consisting of oxygen, ozone, nitrous oxide, carbon monoxide, and water to deposit a dielectric layer comprising silicon, carbon, and oxygen on the substrate; and
    depositing a layer comprising silicon and carbon on the dielectric layer.

2. The method of claim 1, wherein the one or more oxidizing gases is oxygen.

3. The method of claim 1, wherein the dielectric layer is deposited using RF power.

4. The method of claim 1, wherein the organosilicon compound is selected from the group consisting of dimethylsilanediol, diphenylsilanediol, dimethyldimethoxysilane, diethyldiethoxysilane, dimethyldiethoxysilane, diethyldimethoxysilane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, 1,3,5,7-tetramethylcyclotetrasiloxane, octamethylcyclotetrasiloxane, 1,3,5,7,9-pentamethylcyclopentasiloxane, 1,3,5,7-tetrasilano-2,6-dioxy-4,8-dimethylene, 1,3,5-trisilanetetrahydropyran, and 2,5-disilanetetrahydrofuran.

5. The method of claim 1, wherein the organosilicon compound is selected from the group consisting of methylsilane, dimethylsilane, trimethylsilane, tetramethylsilane, dimethylsilanediol, ethylsilane, phenylsilane, diphenylsilane, diphenylsilanediol, methylphenylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, dimethyldimethoxysilane, diethyldiethoxysilane, dimethyldiethoxysilane, diethyldimethoxysilane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, 1,3,5,7-tetramethylcyclotetrasiloxane, octamethylcyclotetrasiloxane, 1,3,5,7,9-pentamethylcyclopentasiloxane, 1,3,5,7-tetrasilano-2,6-dioxy-4,8-dimethylene, 1,3,5-trisilanetetrahydropyran, and 2,5-disilanetetrahydrofuran.

6. The method of claim 1, wherein the organosilicon compound is octamethylcyclotetrasiloxane.

7. The method of claim 1, wherein the layer comprising silicon and carbon is deposited in the presence of RF power.

8. The method of claim 1, wherein the layer comprising silicon and carbon is an oxygen doped silicon carbide layer.

9. The method of claim 1, wherein the dielectric layer comprises carbon-silicon bonds and has a dielectric constant less than about 3.

10. A method for processing a substrate, comprising:
    reacting an alkylsilane having one methyl group bonded to silicon with carbon dioxide and one or more oxidizing gases selected from the group consisting of oxygen, ozone, nitrous oxide, carbon monoxide, and water to deposit a dielectric layer comprising silicon, carbon, and oxygen on the substrate; and
    depositing a layer comprising silicon and carbon on the dielectric layer.

11. The method of claim 10, wherein the alkylsilane is methylsilane or methylphenylsilane.

12. The method of claim 10, wherein the one or more oxidizing gases is oxygen.

13. The method of claim 10, wherein the dielectric layer is deposited using RF power.

14. The method of claim 10, wherein the organosilicon compound is selected from the group consisting of methylsilane, dimethylsilane, trimethylsilane, tetramethylsilane, dimethylsilanediol, ethylsilane, phenylsilane, diphenylsilane, diphenylsilanediol, methylphenylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, dimethyldimethoxysilane, diethyldiethoxysilane, dimethyldiethoxysilane, diethyldimethoxysilane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, 1,3,5,7-tetramethylcyclotetrasiloxane, octamethylcyclotetrasiloxane, 1,3,5,7,9-pentamethylcyclopentasiloxane, 1,3,5,7-tetrasilano-2,6-dioxy-4,8-dimethylene, 1,3,5-trisilanetetrahydropyran, and 2,5-disilanetetrahydrofuran.

15. The method of claim 10, wherein the layer comprising silicon and carbon is an oxygen doped silicon carbide layer.

16. A method for processing a substrate in a chemical vapor deposition chamber, comprising:
    introducing an organosilicon compound into the chamber;
    introducing an oxidizing gas comprising carbon dioxide and one or more oxidizing gases selected from the group consisting of oxygen, ozone, nitrous oxide, carbon monoxide, and water into the chamber;
    depositing a dielectric layer on the substrate using a chemical vapor deposition process at a substrate temperature between about 170° C. and about 180° C., wherein the dielectric layer comprises silicon, oxygen, and carbon; and
    depositing a layer comprising silicon and carbon on the dielectric layer.

17. The method of claim 16, wherein the one or more oxidizing gases is oxygen.

18. The method of claim 16, wherein the dielectric layer is deposited using RF power.

19. The method of claim 16, wherein the organosilicon compound is selected from the group consisting of methylsilane, dimethylsilane, trimethylsilane, tetramethylsilane, dimethylsilanediol, ethylsilane, phenylsilane, diphenylsilane, diphenylsilanediol, methylphenylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, dimethyldimethoxysilane, diethyldiethoxysilane, dimethyldiethoxysilane, diethyldimethoxysilane, 1,3-dimethyldisiloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, 1,3,5,7-tetramethylcyclotetrasiloxane, octamethylcyclotetrasiloxane, 1,3,5,7,9-pentamethylcyclopentasiloxane, 1,3,5,7-tetrasilano-2,6-dioxy-4,8-dimethylene, 1,3,5-trisilanetetrahydropyran, and 2,5-disilanetetrahydrofuran.

20. The method of claim 16, wherein the layer comprising silicon and carbon is an oxygen doped silicon carbide layer.

* * * * *

UNITED STATES PATENT AND TRADEMARK OFFICE
CERTIFICATE OF CORRECTION

PATENT NO. : 7,074,708 B2 Page 1 of 1
APPLICATION NO. : 10/789209
DATED : July 11, 2006
INVENTOR(S) : Frederic Gaillard et al.

It is certified that error appears in the above-identified patent and that said Letters Patent is hereby corrected as shown below:

Column 1, Line 48: Insert a period after "film"

Column 9, Line 15: Change "but" to --bus--

Column 9, Line 46: Change "the" to --then--

Column 13, Line 17: Before "inert", change "a" to --an--

Column 13, Line 17: Delete "which"

Column 13, Line 49: Change "of" to --about--

Column 13, Line 51: After "1000", insert --watts--

Column 15, Line 32: After "1000", insert --watts--

Signed and Sealed this

Seventeenth Day of October, 2006

JON W. DUDAS
*Director of the United States Patent and Trademark Office*